United States Patent
Kim et al.

(10) Patent No.: US 9,892,983 B2
(45) Date of Patent: Feb. 13, 2018

(54) APPARATUS FOR FORMING A THIN LAYER AND METHOD OF FORMING A THIN LAYER ON A SUBSTRATE USING THE SAME

(71) Applicant: Samsung Electronics Co., Ltd., Suwon-si, Gyeonggi-do (KR)

(72) Inventors: Min-Kook Kim, Goyang (KR); Bang-Won Kim, Seoul (KR); Yu-Sin Yang, Seoul (KR); Young-Jee Yoon, Yongin-si (KR); Sang-Kil Lee, Yongin-si (KR); Yoo-Seok Jang, Seoul (KR); Chung-Sam Jun, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 103 days.

(21) Appl. No.: 14/975,706

(22) Filed: Dec. 18, 2015

(65) Prior Publication Data

US 2016/0181167 A1    Jun. 23, 2016

(30) Foreign Application Priority Data

Dec. 22, 2014 (KR) .................. 10-2014-0185834

(51) Int. Cl.
| | |
|---|---|
| *C30B 25/16* | (2006.01) |
| *H01L 21/66* | (2006.01) |
| *C30B 29/40* | (2006.01) |
| *C30B 29/52* | (2006.01) |

(52) U.S. Cl.
CPC ............ *H01L 22/26* (2013.01); *C30B 25/165* (2013.01); *C30B 29/40* (2013.01); *C30B 29/52* (2013.01); *H01L 22/12* (2013.01)

(58) Field of Classification Search
CPC ......... C30B 23/00; C30B 25/00; C30B 25/16; C30B 25/165
See application file for complete search history.

(56) References Cited

U.S. PATENT DOCUMENTS

| | | | |
|---|---|---|---|
| 5,705,403 | A | 1/1998 | Baek et al. |
| 6,459,763 | B1 | 10/2002 | Koinuma et al. |
| 7,046,760 | B2 | 5/2006 | Kim et al. |
| 7,583,788 | B2 | 9/2009 | Zheng et al. |

(Continued)

FOREIGN PATENT DOCUMENTS

| | | |
|---|---|---|
| JP | 1998209052 A | 8/1998 |
| JP | 5408085 B | 11/2013 |

*Primary Examiner* — Robert M Kunemund
(74) *Attorney, Agent, or Firm* — Renaissance IP Law Group LLP

(57) ABSTRACT

An apparatus and method of forming an epitaxial layer are provided. The apparatus includes a process chamber in which an epitaxial process is performed to form epitaxial layer on a substrate. A first supplier supplies source gases for the epitaxial layer into the process chamber. A second supplier supplies dopants into the process chamber. A detector detects a composition ratio of the epitaxial layer and a concentration of the dopants in the epitaxial layer during the epitaxial growth process. And a controller controls a mass flow of at least one of the source gases and a mass flow of the dopants in-line with the epitaxial growth process. Accordingly, the layer thickness of the epitaxial layer can be accurately controlled in real time in line with the epitaxial process.

20 Claims, 6 Drawing Sheets

(56) References Cited

U.S. PATENT DOCUMENTS

| | | |
|---|---|---|
| 8,437,450 B2 | 5/2013 | Wall et al. |
| 8,693,635 B2 | 4/2014 | Krohmal |
| 8,731,138 B2 | 5/2014 | Yokhin et al. |
| 2003/0020021 A1* | 1/2003 | Sou .................. G01J 1/429 250/372 |
| 2013/0062628 A1* | 3/2013 | Das .................. H01L 21/02378 257/77 |
| 2014/0159161 A1 | 6/2014 | Adam et al. |
| 2014/0191285 A1 | 7/2014 | Liao et al. |

\* cited by examiner

APPARATUS FOR FORMING A THIN LAYER AND METHOD OF FORMING A THIN LAYER ON A SUBSTRATE USING THE SAME

CROSS-REFERENCE TO RELATED APPLICATIONS

This application claims priority under 35 U.S.C § 119 to Korean Patent Application No. 10-2014-0185834 filed on Dec. 22, 2014 in the Korean Intellectual Property Office, the disclosure of which is incorporated by reference herein in its entirety.

BACKGROUND

1. Field

Example embodiments relate to an apparatus and method for forming a thin layer on a substrate, and more particularly, to an apparatus and method for forming an epitaxial layer on a substrate in an epitaxial growth process.

2. Description of the Related Art

Modern electronic devices are becoming more highly integrated and require increased performance. Accordingly, the line width of gate electrodes and the size of the source/drain regions are becoming smaller. Unfortunately, however, it is difficult to increase the carrier mobility of the electrons in the semiconductor devices in proportion to the size reduction of the semiconductor devices due to the band gap of strained silicon, which significantly reduces the performance of the more highly integrated semiconductor devices. For example, the electrical resistance of the gate electrode and the contact resistance at the source/drain regions each tend to increase along with the increase in the degree of integration of the semiconductor devices. Thus, the electrical resistance of the gate electrode and the contact resistance at the source/drain regions have a significant effect on the amount of device integration possible.

For those reasons, impurities may be implanted into the source/drain regions by an epitaxial process to provide high layer uniformity and increased carrier mobility, thereby forming a hetero-junction thin layer, i.e., an epitaxial layer, on the source/drain regions of the substrate. For example, silicon-germanium (SiGe) layer has been widely used for the contact layer or the impurity layer at the source/drain regions because of its high dielectric constant and the high carrier mobility of silicon germanium (SiGe).

In performing the epitaxial process for forming the epitaxial layer on the source/drain regions, the layer thickness and the composition ratio of hetero elements of the epitaxial layer can be controlled in real time using x-ray diffractometry. More specifically, the layer thickness and the composition ratio of the epitaxial layer are detected using x-ray diffractometry during the epitaxial process, and the mass flow of the source gases into a process chamber may be controlled according to the detected layer thickness and composition ratio. Accordingly, the epitaxial layer may be formed on the substrate to an expected layer thickness with an expected component ratio. Since the detected component ratios and layer thicknesses have a strong linear relationship with the mass flow of the source gases, the layer characteristics of the epitaxial layer can be in-line controlled with high reliability during the epitaxial process just by feeding back the x-ray diffractometry results to a source provider and using them to control the flow of the source gases.

However, if any dopants are provided with the epitaxial process for improving layer process characteristics, the layer characteristics of the epitaxial layer may be changed by the dopants. In particular, the dopants may cause a change in the amount of the hetero elements that participate in the growth of the epitaxial layer due to the physical properties of the dopants.

For instance, during the epitaxial process for forming the SiGe layer, when boron (B) gases are provided to reduce the band gap energy, the relative amount of germanium (Ge) particles in the SiGe layer is reduced due to the diffusitivity of boron (B). Therefore, the layer thickness and the composition ratio of germanium (Ge) of the SiGe layer is dependent upon the mass flow of boron (B) gases as well as the mass flow of the source gases, and thus the predictable linearity between the mass flow of the source gases and the layer thickness and composition ratio does not exist any more.

Since the x-ray diffractometry detects the layer thickness and the composition ratio of the epitaxial layer based on crystal structures thereof, the amount of the dopants cannot be detected by the x-ray diffractometry. Accordingly, when dopants are provided in the epitaxial process, the x-ray diffractometry results are insufficient to provide an accurate in-line control of the mass flow of the source gases for forming the epitaxial layer having the desired characteristics.

SUMMARY

According to principles of the present inventive concepts, it has been recognized that a mass flow of dopants, as well as the mass flow of the source gases, should be continuously monitored and controlled to provide an accurate real-time control of the layer thickness and composition ratio of the epitaxial layer.

Therefore, accurate in-line control of the layer characteristics of the epitaxial layer according to principles of the present inventive concepts includes monitoring and control of the mass flow of the dopants as well as the mass flow of the source gases.

Example embodiments of the present inventive concepts provide an apparatus for performing an epitaxial process in which the mass flows of the source gases and the dopants are accurately controlled in-line with the epitaxial process in real time to control the layer thickness and the composition ratio of the epitaxial layer.

Example embodiments of the present inventive concepts also provide a method of forming an epitaxial layer in which the mass flows of the source gases and the dopants are accurately controlled in real time to control the layer thickness and the composition ratio of the epitaxial layer.

According to exemplary embodiments of the inventive concepts, an apparatus includes a process chamber in which an epitaxial process is performed to form an epitaxial layer on a substrate. A first supplier is configured to supply source gases for the epitaxial layer into the process chamber during the epitaxial process, and a second supplier is configured to supply dopants into the process chamber during the epitaxial process. A detector is provided to detect a composition ratio of the epitaxial layer as well as a concentration of the dopants in the epitaxial layer during the epitaxial process, and a controller is provided to control a mass flow of at least one of the source gases and the dopants in-line with the epitaxial process.

In an example embodiment, the detector may include an irradiator that radiates continuous x-rays onto the epitaxial layer in the process chamber during the epitaxial process, a diffractometer that generates diffraction spectrums of diffraction rays diffracted from the epitaxial layer to detect a composition ratio and a layer thickness of the epitaxial layer from a peak angle of the diffraction spectrums, and a fluorescence spectrometer that detects fluorescent x-rays resulting from the dopants in the epitaxial layer during exposure to the continuous x-rays to calculate the concentration of the dopants in the epitaxial layer.

In an example embodiment, the irradiator may include an x-ray generating unit from which the continuous x-rays may be generated using one or more of an aluminum (Al) plate and/or a magnesium (Mg) plate, for example, as a target metal plate. The irradiator may further include an irradiating unit that radiates the continuous x-rays to the epitaxial layer at an irradiation angle.

In an example embodiment, the epitaxial layer may be arranged in peripheral regions of dies on a plurality of test patterns defined by scribe lines. The continuous x-ray may have a beam size that is smaller than a surface area of each of the test patterns, so that each test pattern may be individually irradiated by a continuous x-ray beam.

In another example embodiment, the epitaxial layer may be arranged in peripheral regions of dies on a plurality of test patterns defined by scribe lines. The continuous x-ray may have a beam size that corresponds to a unit shot covering a plurality of the dies, so that the plurality of the dies may be irradiated by a continuous x-ray beam and a plurality of the test patterns may thereby be exposed to the continuous x-ray at one time.

In an example embodiment, the controller may include a first operator having a reference ratio that may be a reference composition ratio of the epitaxial layer. The controller may compare the reference ratio with a detected ratio that may be the composition ratio detected by the diffractometer. A second operator may be included having a reference concentration that may be a reference concentration of the dopants. The controller may compare the reference concentration with a detected concentration that may be the concentration of the dopants detected by the fluorescence spectrometer. A flow controller may be provided to individually control the mass flows of the source gases and the dopants according to the comparison results of the first and the second operators. A central processing unit may be connected to the first and the second operators and may transfer control signals to the process chamber, the first supplier, the second supplier, and the detector.

In an example embodiment, the first supplier may include a source reservoir holding the source gases, a first supply tube through which the source gases are supplied from the source reservoir to the process chamber, and a first valve that may be arranged on the first supply tube and may control the mass flow of the source gases. The second supplier may include a dopants reservoir holding the dopants, a second supply tube through which the dopants may be supplied from the dopants reservoir to the process chamber, and a second valve that may be arranged on the second supply tube and may control the mass flow of the dopants. The first valve may be controlled by a first flow control signal generated from the flow controller according to the comparison results of the first operator, and the second valve may be controlled by a second flow control signal generated from the flow controller according to the comparison result of the second operator.

In an example embodiment, the central processing unit may generate a check signal notifying an operator to check process environments of the epitaxial process when a ratio of a variation of the detected concentration with respect to a variation of the mass flow of the dopants is negative.

In an example embodiment, process conditions may include a temperature and a pressure in the process chamber and an elapsed time of the epitaxial process.

In an example embodiment, the epitaxial layer may include one of a gallium arsenide indium (InGaAs) layer and a silicon germanium (SiGe) layer, and the dopant may include one or more of carbon (C) and/or boron (B).

According to exemplary embodiments of the inventive concepts, a method of forming an epitaxial layer on a substrate is provided. Process conditions for an epitaxial process may be selected and set and a substrate may be arranged in a process chamber. The process conditions may include a mass flow of source gases, a mass flow of dopants, a reference composition ratio of the source gases, and a reference concentration of the dopants for the epitaxial layer. An epitaxial process may be performed in the process chamber under the process conditions, thereby forming the epitaxial layer on the substrate. During the epitaxial process, a composition ratio of the source gases and a concentration of the dopants in the epitaxial layer may be detected substantially simultaneously by analyzing the epitaxial layer, and a detected ratio and a detected concentration may be determined and provided to a controller. A ratio difference may be calculated by comparing the detected ratio and a reference ratio. The reference ratio may be a reference value of the composition ratio. A concentration difference may be calculated by comparing the detected concentration and a reference concentration. The reference concentration may be a reference value of the concentration of the dopants. The ratio difference and the concentration difference may be determined in a real time during the epitaxial process. If the ratio difference is over an allowable range, the mass flow of the source gases may be changed in response to feedback of the ratio difference to the controller. Likewise, if the concentration difference is over an allowable range, the mass flow of the dopants may be changed in response to feedback of the concentration difference to the controller.

In an example embodiment, the detected ratio may be obtained using x-ray diffractometry, in which continuous x-rays may be generated and supplied to the epitaxial layer and diffraction spectrums of diffraction rays diffracted from the epitaxial layer are measured. The composition ratio of the epitaxial layer may be determined using a peak angle of the diffraction spectrums together with a layer thickness of the epitaxial layer. The detected concentration may be obtained using x-ray fluorescent spectrometry, in which fluorescent x-rays, resulting from the dopants of the epitaxial layer when irradiated with the continuous x-rays, are measured. The concentration of the dopants in the epitaxial layer may be determined using the fluorescent x-rays.

In an example embodiment, the x-ray diffractometry and the x-ray fluorescent spectrometry may be performed individually on each test pattern on the substrate, with each respective test pattern individually irradiated with a continuous x-ray beam.

In an example embodiment, the x-ray diffractometry and the x-ray fluorescent spectrometry may be performed by a unit shot covering a plurality of dies of the substrate, wherein the continuous x-ray is radiated onto a plurality of the test patterns at the same time.

In an example embodiment, the one or more of the process steps may be repeated during the epitaxial process until the ratio difference and the concentration difference are within their allowable ranges.

In an example embodiment, one or more other environmental conditions of the epitaxial process (besides the mass flow of the source gases and the dopants) may be changed when the detected concentration is over the allowable range and when a ratio of a variation of the detected concentration of the dopants to a variation of the mass flow of the dopants is negative.

In an example embodiment, the source gases and the dopants may be complementary with each other in the epitaxial process, such that an increase of the mass flow of the source gases may decrease the detected concentration of the dopants in the epitaxial layer, and such that an increase of the mass flow of the dopants may decrease the detected composition ratio of the source gases in the epitaxial layer.

In an example embodiment, the source gases may include germanium (Ge) and the dopant may include boron (B).

In an example embodiment, before setting the process conditions for the epitaxial process, the reference ratio and the reference concentration may be obtained in advance.

In an example embodiment, the reference ratio and the reference concentration may be obtained from an inspection database that may be generated by an inspection process in a process laboratory (LAB) performed on the substrate on which the epitaxial process is to be completed. The LAB may be separated from a fabrication area in which the epitaxial process is performed.

According to example embodiments of the present inventive concepts, when performing an epitaxial process using source gases including hetero elements and dopants, both the composition ratio of the hetero elements and the dopant concentration may be detected and then compared with a reference ratio and a reference concentration, respectively, to generate a ratio difference and a concentration difference. The ratio difference and the concentration difference may be applied to first and second suppliers, respectively, each arranged in line with the epitaxial process, so that the layer thickness of the epitaxial layer may be controlled in real time during the epitaxial process.

Particularly, when forming an SiGe layer on a wafer using the epitaxial process, control of the mass flow of the germanium (Ge) gases using real time feedback of the ratio difference of germanium (Ge) may be insufficient to provide accurate control over the layer characteristics of the SiGe layer. This is because germanium (Ge) source gases and boron (B) dopants may be complementary with each other in the epitaxial process. However, if, according to principles of the present inventive concepts, the boron (B) concentration and the boron (B) concentration difference are determined together with the germanium (Ge) composition ratio and the germanium (Ge) ratio difference, sufficient control can be provided. For instance, both the germanium (Ge) ratio difference and the boron (B) concentration difference may be supplied back to first and second suppliers in real time to control the mass flows of the source gases and dopants and thereby significantly increase the accuracy of the in-line control over the layer characteristics of the SiGe layer during the epitaxial process.

Further, a fluorescence spectrometer may generate a boron (B) variation ratio in view of the process conditions and the system conditions that may allow the operator to identify environmental errors during the epitaxial process. In particular, the boron (B) variation ratio may be used to produce a warning alarm in response to the boron (B) variation ratio outside of an acceptable range.

BRIEF DESCRIPTION OF THE DRAWINGS

These and other features of the inventive concepts will become more apparent from the following description of exemplary embodiments thereof, made with reference to the accompanying drawings, in which.

DETAILED DESCRIPTION OF THE EMBODIMENTS

Figure 1:
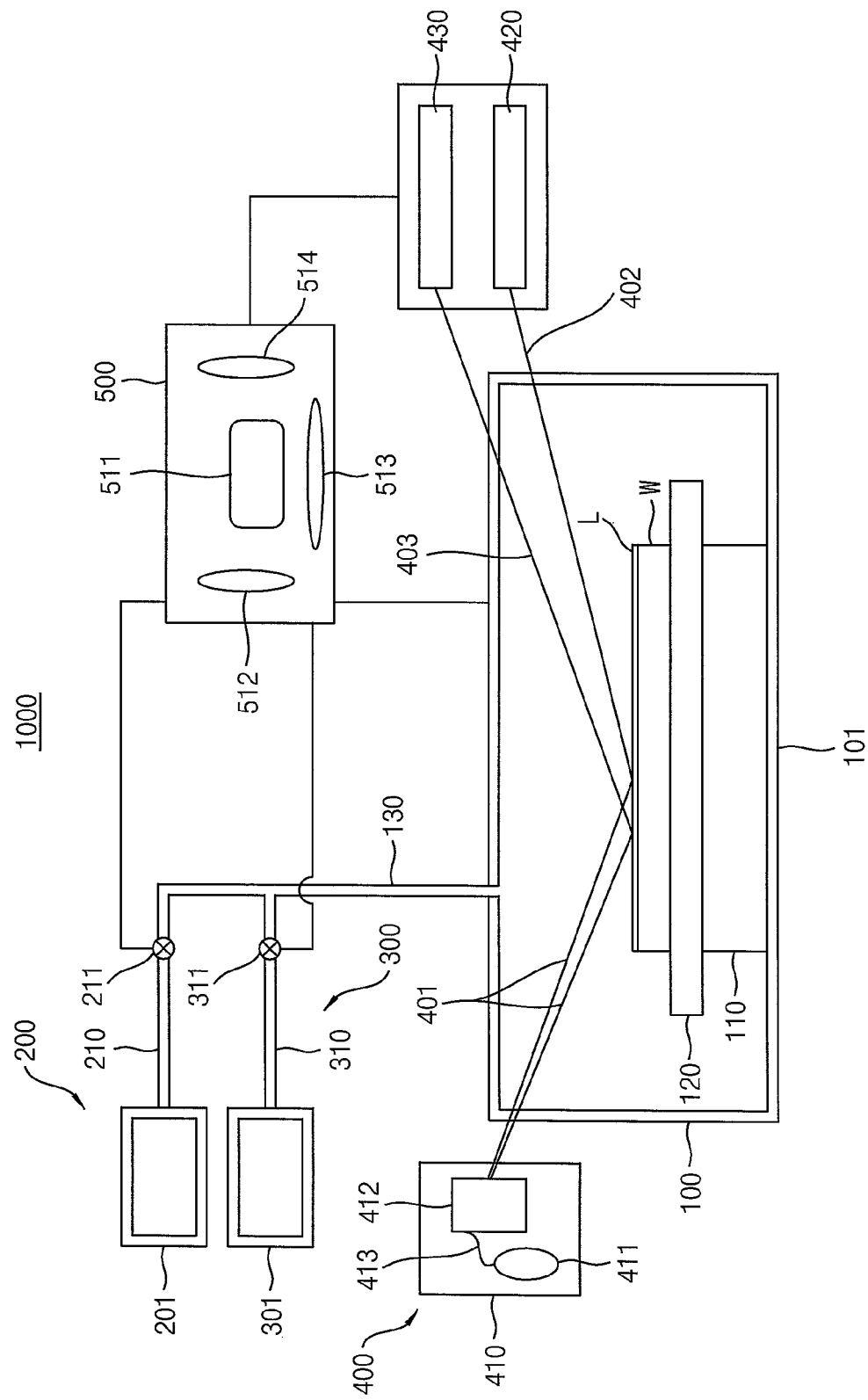
FIG. 1 is a schematic block diagram illustrating a structure of an apparatus for performing an epitaxial growth process in accordance with an example embodiment of the present inventive concepts.

Example embodiments will now be described more fully with reference to the accompanying drawings. The present inventive concepts may be embodied in many different forms and the inventive concepts should not be construed as being limited to the specific embodiments set forth herein. Rather, the example embodiments are provided so that this disclosure will be thorough and complete, and will fully convey the scope of the inventive concepts to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component, or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms "first," "second," "third," etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a "first" element, component, region, layer, and/or section could be termed a "second" element, component, region, layer, and/or section without departing from the inventive concepts.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood, however, that the spatially relative terms are intended to encompass different orientations of the device in use or operation in addition to the orientation depicted in the figures.

The terminology used herein is for the purpose of describing particular example embodiments only and is not intended to be limiting of the inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, the inventive concepts should not be construed as being limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the inventive concepts.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a schematic block diagram illustrating an apparatus for performing an epitaxial growth process in accordance with an example embodiment of the present inventive concepts.

Referring to FIG. 1, an apparatus 1000 for performing an epitaxial growth process may include a process chamber 100 in which an epitaxial layer is formed on a substrate by the epitaxial process, a first supplier 200 supplying source gases for the epitaxial layer into the process chamber 100, a second supplier 300 supplying dopants into the process chamber 100, a detector 400 detecting a composition ratio of the epitaxial layer and a concentration of the dopants in the epitaxial layer, and a controller 500 that controls a mass flow of at least one of the source gases and the dopants.

In an example embodiment, the process chamber 100 may include a loading unit 110 located on a bottom plate 101 and a substrate support 120 secured to the loading unit 110. A substrate W, such as a semiconductor wafer, may be secured to the substrate support 120.

For example, the loading unit 110 may be linearly and rotationally moved in a vertical or a horizontal direction by a driver (not shown). The substrate W may be extracted from a substrate transfer such as a wafer cassette and may be loaded to the loading unit 110 in the process chamber 100. The substrate support 120 may be positioned on the loading unit 110 and may support and secure the substrate W in the epitaxial growth process. A heater (not shown) may be arranged in the substrate support 120 and may heat the substrate W during the epitaxial growth process. The substrate support 120 may include an electrostatic chuck (ESC) on which the substrate W may be secured to the substrate support 120 by an electrostatic force.

A source line 130 may be arranged at an upper portion of the process chamber 100 and the source gases and dopants for the epitaxial growth process may be supplied to the process chamber 100. The mass flow of the source gases and the dopants may be varied in accordance with the process conditions during the epitaxial growth process.

An epitaxial layer L may be formed on the substrate W through the epitaxial growth process in the process chamber 100. For example, a hetero-junction layer may be formed as the epitaxial layer L around a gate structure on the substrate W.

The substrate W may include a p-type or an n-type semiconductor substrate. For example, the substrate W may include a pure silicon substrate or a composite silicon substrate such as a silicon-on-insulator (SOI) substrate, silicon germanium (SiGe) substrate, silicon carbide (SiC) substrate, and/or a gallium arsenide (GaAs) substrate. A conductive structure such as the gate structure may be arranged on the substrate W.

One or more other semiconductor materials having different band gap energy from the substrate W may be grown on the substrate W by the epitaxial grown process, thereby forming the hetero-junction layer as the epitaxial layer on the substrate W.

Various conductive structures may be arranged on the substrate W around the epitaxial layer L. For example, the gate structures (not shown) of semiconductor devices may be arranged on the substrate W, and the epitaxial layer L may be arranged on the source/drain regions of the substrate W around the gate structures. Otherwise, various interconnectors (not shown) may be interposed between wiring structures and between the wiring structure and a junction layer of the source/drain regions, and the epitaxial layer L may be arranged on the interconnector.

The source gases and the dopants for forming the epitaxial layer L may be supplied into the process chamber 100 via the source line 130 from the first and the second suppliers 200 and 300, respectively.

The first supplier 200 may include a source reservoir 201 holding the source gases, a first supply tube 210 through which the source gases may be supplied from the source reservoir 201 to the process chamber 100, and a first valve 211 that may be arranged on the first supply tube 210. The first valve 211 may be used to control the mass flow of the source gases. The first supply tube 210 may be connected to the source line 130. The second supplier 300 may include a dopants reservoir 301 holding the dopants, a second supply tube 310 through which the dopants may be supplied from the dopants reservoir 301 to the process chamber 100, and a second valve 311 that may be arranged on the second supply tube 310. The second valve 311 may control the mass flow of the dopants. The second supply tube 310 may also be connected to the source line 130. The dopants may increase the carrier mobility of the source gases, so that the band gap energy of the epitaxial layer L may be reduced and the uniformity of the epitaxial layer L may be improved.

For example, the epitaxial layer L may include one of a gallium arsenide indium (InGaAs) layer and a silicon germanium (SiGe) layer, and the dopant may include one of carbon (C) and boron (B). In the present example embodiment, the epitaxial layer L may include a silicon germanium (SiGe) layer that may be formed by the epitaxial growth process using germanium (Ge) gases as the source gas and boron (B) gases as the dopant.

As described in detail hereinafter, the first and the second valves 211 and 311, respectively, may be automatically controlled in-line with the epitaxial process for fabricating semiconductor devices depending on the composition ratio of the source gases and the concentration of the dopants in the epitaxial layer L. Therefore, the mass flow of the source gases and the dopants may be controlled in real time during the epitaxial process based upon the layer characteristics of the epitaxial layer L.

In an example embodiment, the detector 400 may include an irradiator 410 that may radiate continuous x-rays onto the epitaxial layer L during the epitaxial growth process in the process chamber 100. The detector 400 may also include a diffractometer 420 generating diffraction spectrums of diffraction rays diffracted from the epitaxial layer L. The detector 400 may detect the composition ratio and a layer thickness of the epitaxial layer from a peak angle of the diffraction spectrums. The detector 400 may also include a fluorescence spectrometer 430 that detects fluorescent x-rays generated from the dopants of the epitaxial layer L in response to the continuous x-rays. The detector 400 may calculate the concentration of the dopants in the epitaxial layer L using information obtained from the fluorescence spectrometer 430.

For example, the irradiator 410 may include an x-ray generating unit 411 from which the continuous x-rays are generated using a target plate and an irradiating unit 412 that radiates the continuous x-rays to the epitaxial layer L at an irradiation angle.

Figure 2:
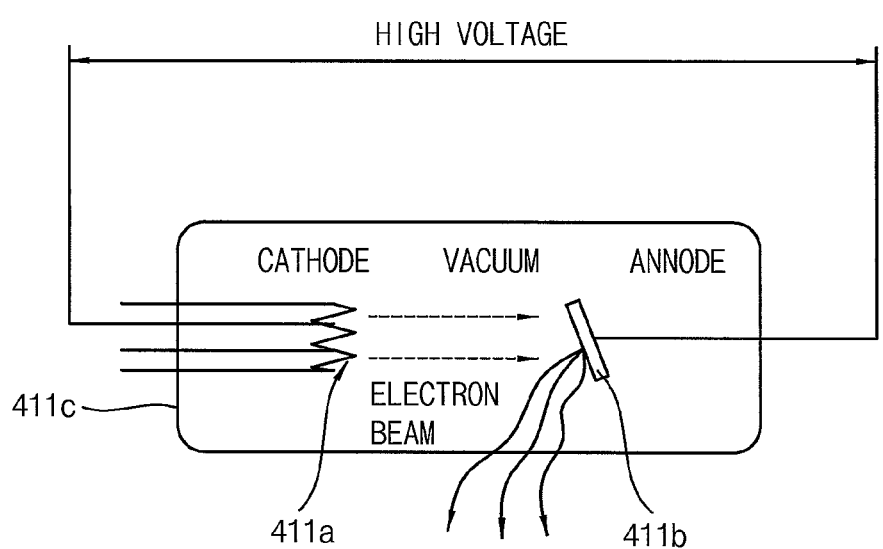
FIG. 2 is a schematic diagram illustrating the x-ray generating unit of the irradiator of the apparatus shown in FIG. 1.

FIG. 2 is a structural view illustrating the x-ray generating unit of the irradiator shown in FIG. 1.

Referring to FIG. 2, the x-ray generating unit 411 may include a filament 411a from which an electron beam may be discharged at a high voltage, a target plate 411b from which the continuous x-rays may be generated in response to a collision with the electron beam, and a vacuum discharge tube 411c enclosing the filament 411a and the target plate 411b.

The intensity of the x-ray may be determined by physical properties of the target plate 411b. In the present example embodiment, the target plate 411b may include a metal for generating an x-ray having a relatively low energy, thereby minimizing the damage to the substrate W due to the x-ray. For those reasons, the target plate 411b may, for instance, include an aluminum (Al) plate and/or a magnesium (Mg) plate.

The x-ray generated from the x-ray generating unit 411 may be radiated onto the substrate W at the irradiation angle by the irradiating unit 412. More particularly, the irradiating unit 412 may control the irradiation angle with respect to the diffractometer 420 and the fluorescence spectrometer 430 for improving the efficiency and accuracy of the x-ray diffraction analysis and the x-ray fluorescence analysis. Thus, the irradiating unit 412 may include an operator (not shown) for changing the position thereof and changing the irradiation angle, and a flexible optical cable 413 may connect it to the x-ray generating unit 411. The x-ray may be guided to the irradiating unit 412 from the x-ray generating unit 411 via the flexible cable 413 regardless of the position of the irradiating unit 412.

Although not shown in figures, a crystal plate may be further provided with the detector 400 for changing the irradiation angle in view of the diffraction analysis and the fluorescence analysis. For example, a diffraction crystal plate (not shown) may be provided with the irradiating unit 412 for varying the optical properties of the x-ray in view of the diffraction from the epitaxial layer L, to thereby efficiently generate the diffraction spectrums with respect to the epitaxial layer L. In addition, a reflection crystal plate (not shown) having a crystal pitch corresponding to a wavelength of the fluorescent x-ray may be arranged in front of the fluorescence spectrometer 430, so that the fluorescent x-ray derived from the dopants of the epitaxial layer L in response to the continuous x-ray may be accurately detected by the fluorescence spectrometer 430.

The continuous x-rays may be diffracted from the epitaxial layer L according to the crystal structure of epitaxial layer L, and the diffraction ray generated from the epitaxial layer L may therefore correspond to the properties of the epitaxial layer L. The diffractometer 420 may detect the diffraction rays and may generate the diffraction spectrums based on a diffraction angle and an intensity of the diffraction rays. Then, a particular diffraction angle corresponding to a maximum point of the intensity may be specified as a peak angle of the diffraction spectrums. The peak angle may correspond to the layer thickness and composition ratio of the epitaxial layer L.

The fluorescent x-ray (characteristic x-ray) may be generated or derived from the dopants present in the epitaxial layer L in response to the continuous x-ray radiated onto the epitaxial layer L. The fluorescent x-ray may be reflected from the reflection crystal plate and may be focused to the fluorescence spectrometer 430. The fluorescence spectrometer 430 may generate information corresponding to the concentration of the dopants in the epitaxial layer L based upon the intensity of the detected fluorescent x-ray.

The beam size of the continuous x-ray may be varied according to a desired detection area of the substrate W.

Figure 3A:
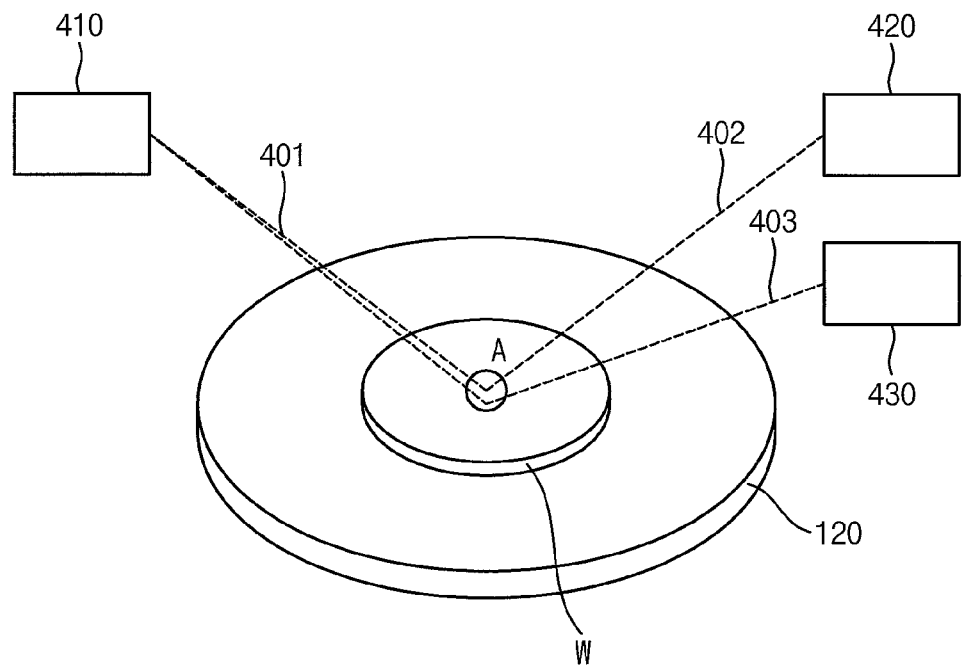
FIG. 3A is a schematic diagram illustrating a diffraction process in which an a continuous x-ray is diffracted or reflected from the epitaxial layer as a diffraction ray and a fluorescent x-ray.
Figure 3B:
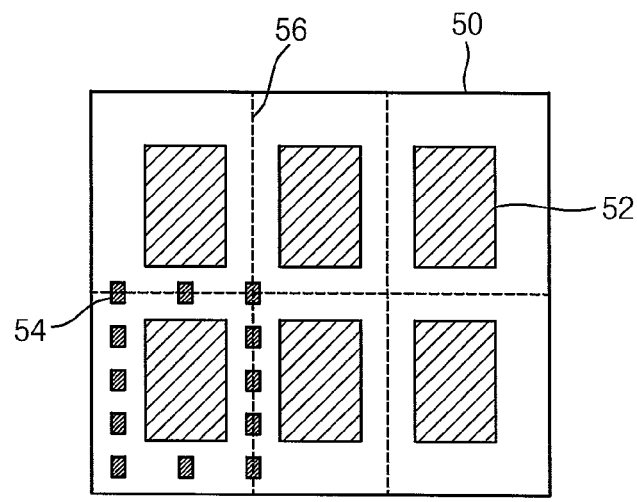
FIG. 3B is a schematic block diagram illustrating a detection area of the epitaxial layer on the substrate.

FIG. 3A is a schematic diagram illustrating how the continuous x-ray 401 is diffracted or reflected from the epitaxial layer as a diffraction ray 402 and a fluorescent x-ray 403, and FIG. 3B is a schematic block illustrating a detection area of the epitaxial layer on the substrate.

Referring to FIGS. 3A and 3B, the continuous x-rays may be radiated onto a detection area A of the epitaxial layer L on the substrate W from an irradiator 410, and the diffraction rays 402 diffracted from the detection area A of the epitaxial layer L may be detected by the diffractometer 420. The layer thickness and composition ratio of the epitaxial layer L may thereafter be obtained by analyzing the diffraction spectrums of the diffraction rays 402 in the diffractometer 420. In addition, the fluorescent x-rays 403 reflected from the dopants in the detection area A of the epitaxial layer L may be detected by the fluorescence spectrometer 430, and the concentration of the dopants of the epitaxial layer L may be determined by analyzing the intensity of the detected fluorescent x-rays.

More particularly, when a thin layer is formed on a wafer for manufacturing semiconductor devices, the detection area A may correspond to a unit shot of illumination to the wafer, or to a test pattern that may be arranged at a peripheral portion of a die having chips.

For example, the substrate W may include a plurality of dies 52 in which a plurality of chips may be arranged, and the dies 52 may be separated from each other by scribe lines 56. A plurality of test patterns 54 having layer structures that are the same as pattern structures of the chip may be arranged on a peripheral region of the dies 52. In such a substrate W, a plurality of the dies 52 may be exposed to a unit shot 50 of a photo mask pattern for a photolithography process, and thus a plurality of the dies 52 may be exposed to an illumination light of the photolithography process at the same time through the unit shot 50.

Alternatively, the continuous x-ray may be controlled to have a beam size smaller than a surface area of the test pattern 54, and the continuous x-ray may be radiated onto the substrate W with respect to a single test pattern 54. That is, the continuous x-ray may be individually radiated onto the test pattern 54 around one of the dies 52, and the composition ratio of the source gases and the concentration of the dopants in the epitaxial layer may be obtained with respect to each test pattern 54 around each of the dies 52.

Since the test pattern 54 may be formed by the same patterning process as the pattern structures of the chip, the layer characteristics of the test pattern 54 may be the same as those of the pattern structures of the chip. Thus, the layer characteristics of the epitaxial layer of the chip may be measured by optical detection of x-rays radiated to the epitaxial layer of the test patterns, and not by direct optical detection of x-rays radiated to the epitaxial layer of the pattern structure of the chip in the dies 52.

In still another embodiment, the continuous x-ray may be controlled to have a beam size corresponding to the unit shot 50 of the photo mask pattern, and thus the continuous x-ray may be radiated onto the substrate W by the unit shot 50. In this embodiment, the continuous x-ray may be radiated onto a plurality of the test patterns 54 around the dies 52 exposed to the unit shot 50, and the composition ratio of the source gases and the concentration of the dopants in the epitaxial layer L may be obtained as average values over the test patterns 54 exposed through the unit shot 50.

The controller 500 may be connected to the process chamber 100, the first and the second suppliers 200 and 300, respectively, and the detector 400. The controller 500 may control the mass flow of at least one of the source gases and at least one of the dopants during the epitaxial process for forming the epitaxial layer L on the substrate W in the process chamber 100. More particularly, the detector 400 may be controlled by the controller 500 to obtain the layer characteristics and the dopant concentration of the epitaxial layer L. The controller 500 may thereafter change one or more process conditions in line with the epitaxial process, including, for instance, the mass flow of the source gases and/or the dopants, based on the layer characteristics and the dopant concentration obtained from the detector 400. That is, the mass flow of the source gases and/or the dopants may be controlled in-line with the epitaxial process in the fabrication (FAB) process for semiconductor devices, so that the process conditions of the epitaxial process may be corrected in real time while performing the epitaxial process. The layer characteristics of the epitaxial layer L may thereby be optimized during the epitaxial process.

The controller 500 may include a central processing unit 511 that communicates control signals to the process chamber 100, the first supplier 200, the second supplier 300 and the detector 400. A first operator 512 may provide a reference ratio. The reference ratio may be a desired composition ratio of the epitaxial layer. The central processing unit 511 may compare the reference ratio with a composition ratio detected by the diffractometer 420 (the detected ratio). A second operator 513 may provide a reference concentration. The reference concentration may be a desired concentration of the dopants. The central processing unit 511 may compare the reference concentration with a detected concentration representing the concentration of the dopants as detected by the fluorescence spectrometer 430. A flow controller 514 may be provided to separately control the mass flows of the source gases and the dopants based upon the comparison results of the first and the second operators 512 and 513, respectively.

The central processing unit 511 may be connected to the first and the second operators 512 and 513, respectively, and the flow controller 514, and may transfer control signals to the process chamber 100, the first and the second suppliers 200 and 300, respectively, and the detector 400. Thus, the process conditions, including the mass flow of the source gases and the dopants, may be changed or corrected in line with the epitaxial process in real time based upon the comparison results of the first and the second operators 512 and 513, respectively.

A large number of samples of process-completed wafers may be analyzed at a process laboratory (LAB) that may be separate from the fabrication (FAB) process area, and the epitaxial layers on the process-completed wafers may be inspected by various inspection systems to determine layer characteristics and process defects to provide a database of reference information. Thus, the database of reference information may include a large quantity of the composition ratios of the source gases and the concentrations of the dopants in the epitaxial layers accumulated over a long period of time in the LAB. The reference ratio and the reference concentration may be the average values of the composition ratios of the source gases and the concentrations of the dopants, respectively, as obtained from the LAB database. Since the LAB may be electrically connected to the controller 500 of the apparatus 1000, the average values of the composition ratios of the source gases and the concentrations of the dopants in the LAB may be stored in a memory unit of the first and the second operators 512 and 513, respectively, as the reference ratio and the reference concentration, respectively. The reference ratio and the reference concentration may also or alternatively be stored in a memory unit of the central processing unit 511.

In greater detail, a secondary ion mass spectroscopy (SIMS) and an x-ray diffractometry (XRD) process may be simultaneously conducted on the epitaxial layer of a process-completed wafer in the LAB. A depth profile of the hetero elements of the epitaxial layer and the composition ratio and dopant concentration of the epitaxial layer may thereby be accurately obtained and may be stored in an inspection database in the LAB. Based on the inspection database, an expected dopant concentration and an expected composition ratio of the epitaxial layer in a specific epitaxial process may be generated in the LAB. The expected dopant concentration and the expected composition ratio of the epitaxial layer may be transferred to the controller 500 as the reference ratio and the reference concentration, respectively.

The detected ratio detected by the diffractometer 420 may be transferred to the first operator 512 and may be compared with the reference ratio obtained from the LAB. The difference between the detected ratio and the reference ratio, referred to as ratio difference, may be generated in the first operator 512. When the ratio difference is over a preset allowable range, the central processing unit 511 may apply a source control signal to the flow controller 514. The flow controller 514 may control the first valve 211 of the first supplier 200 in response to the source control signal and may control the mass flow of the source gases for reducing the ratio difference. Therefore, the ratio difference may be applied back to the first supplier 200 in real time during the epitaxial process to continuously correct process conditions.

In the same way, the detected concentration detected by the fluorescence spectrometer 430 may be transferred to the second operator 513 and may be compared with the reference concentration that may be transferred from the LAB, so that the difference between the detected concentration and the reference concentration, referred to as concentration difference, may be generated in the second operator 513. When the concentration difference is over a preset allowable range, the central processing unit 511 may apply a dopant control signal to the flow controller 514. The flow controller 514 may control the second valve 311 of the second supplier 300 in response to the dopant control signal, and may control the mass flow of the dopants for reducing the concentration difference. Therefore, the concentration difference may be applied back to the second supplier 300 in real time during the epitaxial process to continuously correct process conditions.

The flow controller 514 may control the first and the second valves 211 and 311, respectively, in response to the source control signal and the dopant control signal, respectively, so that the mass flow of the source gases and the dopants may be separately and individually controlled by the flow controller 514.

In the present example embodiment, the generation of the ratio difference, the feedback of the ratio difference to the first supplier 200, and the flow control of the source gases may be repeatedly performed in line with the epitaxial process, until the composition ratio of the epitaxial layer L converges with the reference ratio. In the same way, the generation of the concentration difference, the feedback of the concentration difference to the second supplier 300, and the flow control of the dopants may be repeatedly performed in line with the epitaxial process, until the dopant concentration of the epitaxial layer L converges with the reference concentration. For example, the epitaxial layer may include one of a gallium arsenide indium (InGaAs) layer and a silicon germanium (SiGe) layer, and the dopant may include one of carbon (C) and boron (B).

Some particular behaviors of the dopant concentration of the epitaxial layer may further provide information on environmental defects of the epitaxial process caused by environmental conditions, including system failures of the apparatus 1000, and may reflect characteristics not related to the mass flow of the source gases and the dopants.

Figure 4:
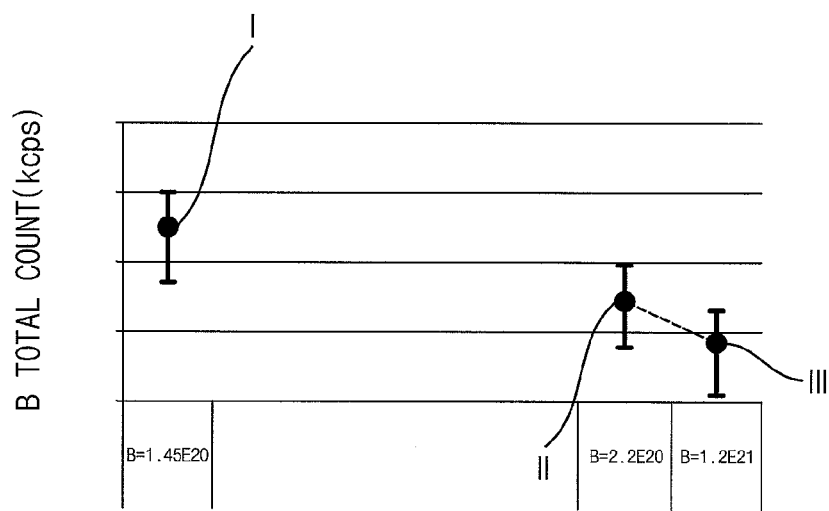
FIG. 4 is a graph illustrating examples of unexpected dopant concentrations that may be detected by the fluorescence spectrometer.

FIG. 4 is a graph illustrating examples of unexpected dopant concentrations that may be detected by the fluorescence spectrometer. In FIG. 4, the horizontal line denotes the mass flow of the dopants from the second supplier to the process chamber and the vertical line denotes the detected dopants in the epitaxial layer L as a unit of kilo-counter per second (kcps). A first concentration I of the dopants was detected from a first epitaxial layer that was formed under the normal mass flow ($1.45E20$ atoms/cm$^3$) of the dopants. A second concentration II of the dopants was detected from a second epitaxial layer that was formed under a first variation of the mass flow ($2.2E20$ atoms/cm$^3$) approximately corresponding to about 1.5 times the normal mass flow of the dopants. And a third concentration III of the dopants was detected from a third epitaxial layer that was formed under a second variation of the mass flow ($1.1E21$ atoms/cm$^3$) approximately corresponding to about 7.6 times the normal mass flow of the dopants.

Referring to FIG. 4, although the first variation of the mass flow may be slightly larger than the normal mass flow and the second variation of the mass flow are greatly larger than the normal mass flow, the second and the third concentrations II and III of the dopants are smaller than the first concentration I.

In normal process conditions of the epitaxial process in the process chamber 100, the increase of the mass flow of the dopants naturally results in an increase of the dopant concentration. Thus, the above results in FIG. 4 may indicate that the decrease of the dopant concentration in spite of the increase of the mass flow of the dopants may be caused by environmental failures such as configuration errors, leakages of pipe lines, and/or mistakes in setting process conditions of the epitaxial process, rather than by the unbalance of the mass flow of the source gases and the dopants.

Therefore, when a ratio of the variation of the detected dopant concentration with respect to the variation of the mass flow of the dopants (referred to as a dopant variation ratio), is negative, reflecting a variation of the detected dopant concentration that is inversely proportional to the variation of the mass flow of the dopants, an abnormal process signal may be generated in the second operator 513 and may be communicated to the central processing unit 511. In response to the abnormal process signal, the central processing unit 511 may generate a check signal that indicates to an operator the need to check the environmental conditions. In addition, a warning signal such as an audible and/or visual alarm may be generated together with the check signal to immediately alert an operator against the abnormal configurations or setting errors of the apparatus 1000.

For example, the environmental conditions of the epitaxial process may include various parameters other than the mass flows of the source gases and the dopants. Examples of the environmental conditions may include process conditions such as a process temperature and a process pressure of the process chamber 100, as well as an elapsed time of the epitaxial process, and system conditions such as physical failures of the process chamber 100, connection failures of the pipe lines and valve deterioration.

While the present example embodiments provide the abnormal process signal when the dopant variation ratio is negative, any other configurations and conditions indicative of system or process errors may be set to cause the apparatus to generate the abnormal process signal, depending on the requirements of the apparatus 1000.

For example, an excessively small or large dopant variation ratio may also result from abnormal environmental conditions of the epitaxial process, and the abnormal process signal may therefore also be generated when the dopant variation ratio may be excessively small or large.

According to the above apparatus for forming the epitaxial layer, when performing an epitaxial process using source gases including hetero elements and dopants, both the composition ratio of the hetero elements and the dopant concentration may be substantially simultaneously detected and may be compared with the reference ratio and the reference concentration, respectively, to thereby generate the ratio difference and the conference difference. The ratio difference and the concentration difference may be applied to the first and the second suppliers, respectively, in line with the epitaxial process, so that the layer thickness of the epitaxial layer may be controlled in real time.

More particularly, when forming the SiGe layer on a wafer through the epitaxial process, controlling the mass flow of the germanium (Ge) gases using a real time feedback of the ratio difference of germanium (Ge) may be insufficient for accurate control of the layer characteristics of the SiGe layer, since germanium (Ge) source gases and boron (B) dopants may be complementary with each other in the epitaxial process.

However, using the principles of the present inventive concepts, if the boron (B) concentration and the boron (B) concentration difference are also generated together with the germanium (Ge) composition ratio and the germanium (Ge) ratio difference, both the germanium (Ge) ratio difference and the boron (B) concentration difference may be applied back to the first and the second suppliers, respectively, in real time in the epitaxial process, thereby significantly increasing the accuracy of the in-line control of the layer characteristics of the SiGe layer. In addition, the fluorescence spectrometer 430 may further be used to generate a boron (B) variation ratio that may allow the early detection of environmental errors of the epitaxial process. For instance, errors in the process conditions and/or the system conditions may be detected using the boron (B) variation ratio and a warning alarm maybe provided in response to the boron (B) variation ratio.

Figure 5:
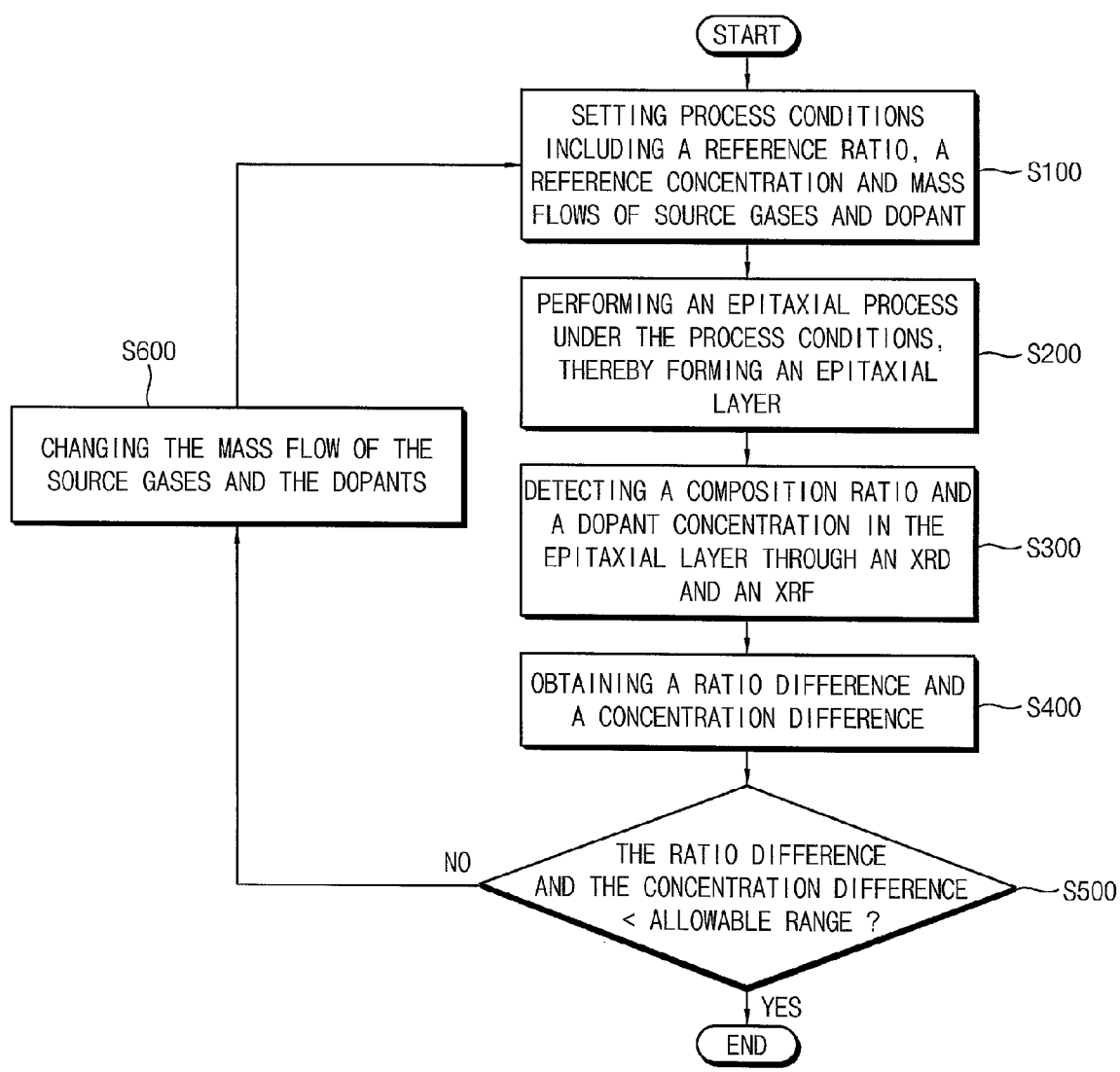
FIG. 5 is a flow chart illustrating a method of forming an epitaxial layer using an apparatus such as that shown in FIG. 1, in accordance with an example embodiment of the present inventive concepts.

FIG. 5 is a flow chart illustrating a method of forming an epitaxial layer according to principles of the present inventive concepts, for instance, using the apparatus shown in FIG. 1.

Referring to FIGS. 1 and 5, the process conditions for the epitaxial process may be set using the controller 500 of the apparatus 1000, and a substrate W may be arranged in the process chamber 100 (step S100). More particularly, the process conditions may include the mass flow of the source gases and the mass flow of the dopants along with the reference composition ratio of the source gases and the reference concentration of the dopants for the epitaxial layer.

In an example embodiment, the reference ratio and the reference concentration may be obtained through a theoretical calculation for determining the desired layer characteristics and the dopant concentration for the epitaxial layer L in a design step of the semiconductor devices. Alternatively, the reference ratio and the reference concentration may be obtained from an inspection database of a process laboratory (LAB) that may be separate from the fabrication (FAB) area, where the fabricating process is performed. Where an inspection database is used, the reference ratio may be a mean value of the composition ratio data from the sampled epitaxial layers, and the reference concentration may be a mean value of the dopant concentration data obtained from the sampled epitaxial layers.

In still another example, the reference ratio and the reference concentration may be obtained by inspecting a non-patterned wafer and correcting the inspection data using the theoretical calculation or the mean inspection data values of the LAB analysis of the epitaxial layers. For instance, a non-patterned wafer may be inspected in the LAB using a secondary ion mass spectroscopy (SIMS) or an x-ray diffractometry, thereby obtaining an accurate depth profile of the dopants with respect to the non-patterned wafer including a non-patterned composition ratio and a non-patterned dopant concentration. Then, the non-patterned composition ratio and the non-patterned dopant concentration may be corrected using the theoretical composition ratio and the dopant concentration, or using the mean values of the inspection data for the composition ratios and the dopant concentrations of the sampled epitaxial layers, thereby generating the reference ratio and the reference concentration.

Thereafter, the mass flow of the source gases and the mass flow of the dopants may be set using the controller 500.

Once the reference ratio and the reference concentration are determined for the epitaxial process, a mass flow of the source gases corresponding to the reference ratio and a mass flow of the dopants corresponding to the reference concentration may each be set as initial mass flows using the controller 500. A process temperature, a process pressure, and a process time of the epitaxial process may also be set using the controller 500.

After the process conditions have been set, the epitaxial process may be performed on the substrate W in the process chamber 100 under the established process conditions, with the source gases and the dopants initially flowing into the process chamber at the initial mass flow (step S200). Accordingly, the hetero elements having a different energy band from the substrate W may be grown up on the substrate W using the epitaxial process, thereby forming the epitaxial layer L on the substrate W. In addition, since the dopants may be added during the epitaxial process, the energy band gap of the epitaxial layer L may be sufficiently reduced.

In one embodiment, the source gases may include germanium (Ge) and the dopant may include boron (B), and thus the epitaxial layer L may include a silicon germanium (SiGe) layer.

In the epitaxial process, germanium (Ge) and boron (B) may be complementary to each other. Thus, as the amount of germanium (Ge) increases in the process chamber 100, the dopant concentration in the epitaxial layer L may be decreased. Similarly, the dopant concentration in the epitaxial layer L may be increased when the amount of germanium (Ge) decreases in the process chamber 100. In the same way, when the amount of boron (B) increases in the process chamber 100, the composition ratio of germanium (Ge) in the epitaxial layer L may be decreased, and conversely, the composition ratio of germanium (Ge) in the epitaxial layer L may increase when the amount of boron (B) decreases in the process chamber 100.

Therefore, the composition ratio of germanium (Ge) and the layer thickness of the SiGe layer may be varied according to both the mass flow of germanium (Ge) and the mass flow of boron (B). Therefore, accurate control of the layer characteristics of the SiGe layer may require the control of both the mass flow of boron (B) and the mass flow of germanium (Ge). According to principles of the present inventive concepts, a concentration of the dopants may be detected together with a composition ratio of the source gases in the epitaxial process, and the mass flow of the dopants (i.e., boron (B)) may be accurately controlled together with the mass flow of the source gases (i.e., germanium (Ge)).

The composition ratio of the source gases and the concentration of the dopants in the epitaxial layer L may be detected, for instance, by analyzing the epitaxial layer L through an x-ray diffractometry (XRD) process and an x-ray fluorescence spectrometry (XRF) process, thereby generating a detected ratio and a detected concentration (step S300).

For example, the composition ratio of the source gases in the epitaxial layer L may be detected by analyzing the epitaxial layer L through the x-ray diffractometry (XRD) process. In this process, continuous x-rays may 401 be radiated onto the epitaxial layer L on the substrate W from the irradiator 410. The continuous x-rays 401 may be diffracted from the epitaxial layer L at various angles depending on the crystal structure of the layer L, thereby generating diffraction rays 402 from the epitaxial layer L that are based on the composition ratio of the source gases. The diffraction rays 402 may be detected as diffraction spectrums by the diffractometer 420, in which constructive interference and destructive interference of the diffraction rays may be alternately generated. The composition ratio of the source gases in the epitaxial layer L may be detected from the peak angle of the diffraction spectrums together with the layer thickness of the epitaxial layer L.

In addition, the concentration of the dopant in the epitaxial layer L may be detected by analyzing the epitaxial layer L using the x-ray fluorescence spectrometry (XRF) process. Again, the continuous x-rays may be radiated onto the epitaxial layer L on the substrate W from the irradiator 410, and electrons of the dopants in the epitaxial layer L may be transformed into an excitation state having a relatively high energy level. As the electrons of the dopants move from the excitation state to a ground state having a relatively lower energy level, fluorescent x-rays (or characteristic x-rays) 403 may be radiated outwards from the epitaxial layer L. The fluorescent spectrometer 430 may detect the intensity of the fluorescent x-rays 403, and the concentration of the dopants may be determined based upon the intensity of the fluorescent x-rays 403.

The continuous x-rays may, for example, be individually radiated onto every test pattern 54 on the substrate W, so that each test pattern 54 may be individually exposed to the x-rays. Otherwise, the continuous x-rays may be radiated onto the substrate W by a unit shot covering a plurality of dies 52, so that a plurality of the test patterns 54 may be substantially simultaneously exposed to the x-rays.

Once the diffraction rays 402 and fluorescent x-rays 403 are evaluated, a ratio difference between the detected ratio and the reference ratio of the source gases and a concentration difference between the detected concentration and the reference concentration of the dopants may be obtained using the first and the second operators 512 and 513, respectively, (step S400). The ratio difference and the concentration difference may then be compared with an allowable range (step S500).

When the ratio difference and the concentration difference are within the allowable range, the layer characteristics of the epitaxial layer may satisfy the process requirements of the epitaxial process and the current mass flow of the source gases and current mass flow of the dopants may be maintained, along with the other current process conditions. Accordingly, as long as the ratio difference and concentration difference are within an acceptable range, the epitaxial process may continue under the same process conditions.

However, when at least one of the ratio difference and the concentration difference is outside its allowable range, the mass flow of the corresponding one of the source gases and/or the dopants may need to be changed, along with other process conditions. More particularly, the process may modify the mass flow of at least one of the source gases and/or the dopants in response to the ratio difference and the concentration difference received by the first and the second suppliers 200 and 300, respectively (step S600).

For instance, when the ratio difference is outside the allowable range, the central processing unit 511 may apply a source control signal to the flow controller 514 to control the first valve 211 of the first supplier 200. Using the flow controller 514, the mass flow of the source gases may thereby be controlled to reduce the ratio difference in real time during the epitaxial process. Similarly, when the concentration difference is outside the allowable range, the central processing unit 511 may apply a dopant control signal to the flow controller 514 to control the second valve 311 of the second supplier 300. Using the flow controller 514, the mass flow of the dopants may be controlled to reduce the concentration difference in real time during the epitaxial process.

That is, the mass flow of the source gases supplied into the process chamber may be controlled to reduce the ratio difference. Similarly, the mass flow of the dopants supplied into the process chamber 100 may be changed to reduce the concentration difference. Accordingly, the composition ratio of the source gases and/or the concentration of the dopants in the epitaxial layer L may be controlled in real time by controlling the mass flow of the supplied source gases and/or dopants, and real time correction of the layer characteristics of the epitaxial layer L may be performed in line with the epitaxial process using the ratio difference and the concentration difference.

An initial epitaxial layer may begin to be formed on the substrate W under the initial mass flows of the source gases and the dopants. The process conditions may thereafter be tested and, if the ratio difference of the initial epitaxial layer is over the allowable range, the mass flow of the source gases may be modified by the flow controller 514 to a corrected mass flow. A corrected epitaxial layer may thereafter be formed in the process chamber 100 using the corrected mass flow of the source gases. The composition ratio and the dopant concentration may also be tested with respect to the corrected epitaxial layer while the epitaxial process is being performed in the same process chamber 100.

More particularly, when the concentration difference increases in spite of an unchanged mass flow of the dopants, the layer characteristics of the epitaxial layer may be influenced by the amount of the dopants as well as the amount of the source gases. In such a case, the dopant concentration may be detected together with the composition ratio of the source gases, and the mass flow of the dopants may be changed in response to the concentration difference. For instance, the mass flow of the dopants may be changed together with the mass flow of the source gases, so that the epitaxial process may be performed under a corrected mass flow of the source gases and a corrected mass flow of the dopants. Alternatively, the mass flow of the source gases may be fixed, and the mass flow of the dopants may be varied within appropriate ranges. In this embodiment, the epitaxial process may be performed with a constant mass flow of the source gases and with a variable mass flow of the dopants, varying within some range.

The mass flow variation of the source gases may be the same as or different from the mass flow variation of the dopants depending upon the reaction mechanism of the source gases and the dopants in the epitaxial process.

For example, when germanium (Ge) is used as the source gas and born (B) is used as the dopant for forming a silicon germanium (SiGe), the germanium (Ge) and boron (B) concentrations may be complementary to each other in the epitaxial process. In other words, an increase of the mass flow of boron (B) to reduce the concentration difference may lead to an increase in the ratio difference of the source gases. For that reason, modifying the mass flows of the source gases and the dopants should be conducted in view of the complementary behavior of the germanium (Ge) and boron (B) in the epitaxial process.

The composition ratio and the dopant concentration of the corrected epitaxial layer may be repeatedly detected using the same XRD and XRF processes, and, each time, a corrected ratio difference and a corrected concentration difference may be generated by the first and the second operators 512 and 513, respectively, to determine whether it is within an acceptable range. When the corrected ratio difference and/or the corrected concentration difference is outside of the allowable range, the mass flow of the source gases and/or the dopants may be changed again using the same process as described previously with respect to step S600.

Therefore, the step of performing the epitaxial process under the changed mass flow of at least one of the source gases and the dopants, the step of detecting the composition ratio of the source gases and the concentration of the dopants in an epitaxial layer under the changed mass flow of the source gases and the dopants, the step of obtaining the ratio difference and the concentration difference, and the step of changing the mass flow of at least one of the source gases and the dopants may be repeatedly performed until the ratio difference and the concentration difference stay within their respective allowable ranges.

In addition to the features described above, some particular behaviors of the dopant concentration of the epitaxial layer may provide further information with respect to environmental defects of the epitaxial process. These defects may result from process conditions other than the mass flow of the source gases and the dopants, and may include, for instance, system or process failures of the apparatus 1000.

Figure 6:
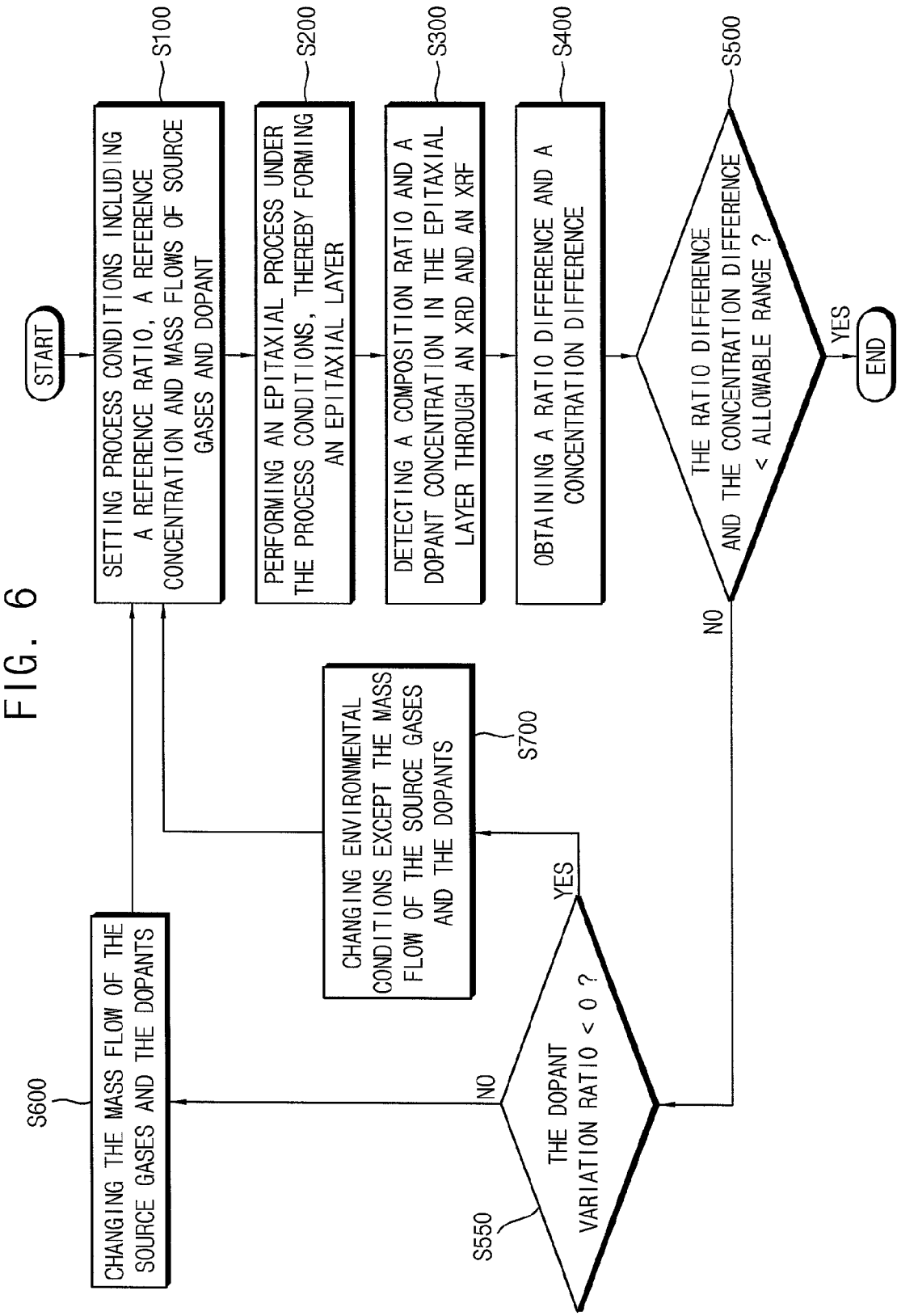
FIG. 6 is a flow chart illustrating a method of forming an epitaxial layer using an apparatus such as that shown in FIG. 1 in accordance with another example embodiment of the present inventive concepts.

FIG. 6 is a flow chart illustrating an alternative method of forming an epitaxial layer according to principles of the present inventive concepts, for instance, using the apparatus shown in FIG. 1. Referring to FIG. 6, the alternative method of forming the epitaxial layer is substantially the same as the method shown in FIG. 5, except for the step of determining whether a dopant variation ratio is allowable or not. Accordingly, the following description will focus on these differences and redundant descriptions of the same steps as shown in FIG. 5 will be omitted.

Referring to FIGS. 1 and 6, the second operator 513 may also be used to provide a dopant variation detector. In particular, when a dopant variation ratio is determined to be negative, indicating that the variation of the detected dopant concentration is inversely proportional to the variation of the mass flow of the dopants (step S550), an abnormal process signal may be generated by the second operator 513 and sent to the central processing unit 511. The central processing unit 511 may in turn generate a check signal in response to the abnormal process signal, indicating to an operator the need to check the process environments. An operator may then check the process environment, including process conditions other than the mass flows of the source gases and the dopants, and, if errors are found, they may be corrected (step S700).

For example, if the dopant concentration is found to decrease despite an increase in the mass flow of the dopants, the dopant concentration decrease may indicate that the epitaxial process is not being performed under normal conditions, rather than an unbalance in the mass flows of the source gases and dopants. For instance, the environmental conditions for the process may include errors such as configuration errors, leakages of pipe lines, and/or mistakes in the setting of the process conditions for the epitaxial process. These errors may retard or prevent the epitaxial process in the process chamber 100. Therefore, the concentration decrease in spite of the increase of the dopant mass flow may indicate the need to change the environmental conditions of the epitaxial process for accurate control of the layer characteristics of the epitaxial layer and/or system failures of the apparatus 1000.

For those reasons, the dopant variation ratio, which represents a ratio of the variation of the detected concentration with respect to the variation of the mass flow of the dopants, may be detected and evaluated using the second operator 513. When the dopant variation ratio is negative indicating that the detected dopant concentration is decreasing in spite of an increase in the mass flow of the dopants (or increasing in spite of a decrease in the mass flow of the dopants), the environmental conditions of the epitaxial process may be checked and properly corrected in response to a check signal produced by the central processing unit 511.

For example, initial process conditions such as an initial temperature or an initial pressure need to be varied to correct for external influences on the process chamber 100. The need for such changes to the initial conditions may be indicated by the dopant variation ratio. Accordingly, when the dopant variation ratio is negative, an abnormal process signal may be generated by the second operator 513 and sent to the central processing unit 511.

The central processing unit 511 may in turn generate a check signal, indicating to an operator the need to check the process environments. In addition, an audible or visual warning signal, such as an alarm sound or light, may be generated along with the check signal to provide an immediately detectable warning to an operator regarding the abnormal configurations or setting errors of the apparatus 1000. The operator can then check the environmental conditions including the process conditions, for instance using preset check algorithms, in response to the check signal from the central processing unit 511.

The environmental conditions of the epitaxial process may include various parameters in addition to the mass flows of the source gases and the dopants. These may include, for instance, process conditions such as a process temperature and a process pressure of the process chamber 100, and an elapsed time of the epitaxial process. These may further include system conditions such as physical failures of the process chamber 100, connection failures of the pipe lines, and/or valve deterioration. System failures of the apparatus 1000 or other errors in the process conditions may be detected early one using the dopant variation ratio. For example, when the dopant variation ratio is unusually small, indicating that the detected concentration is disproportionately small in comparison to the mass flow of the dopants, this may indicate that a large amount of the dopants may not be involved in the epitaxial process and may instead be being prematurely discharged from the process chamber or from the second supplier 300, such as due to a leak of the second supply tube 310 or a deteriorated second valve 311.

Thus, criteria for checking the system conditions may be provided to the second operator 513, and the dopant variation ratio may be determined based on the predetermined criteria. An abnormal system signal may then be generated from the second operator 513 in response to an error determined using the dopant variation ratio.

In summary, according to principles of the present inventive concepts, when performing an epitaxial process in an apparatus using source gases including hetero elements and dopants, both the composition ratio of the hetero elements and the concentration of the dopants (provided for reducing the band gap energy of the epitaxial layer) may be detected substantially simultaneously. The detected composition ratio and dopant concentration may be compared with a reference ratio and a reference concentration, respectively, to generate a ratio difference and a conference difference. The ratio difference and the concentration difference may be supplied to first and second suppliers, respectively, arranged in line with the epitaxial process, so that the layer thickness of the epitaxial layer may be accurately controlled in real time during the epitaxial process.

The mass flow of the dopants, for instance, may be controlled in real time during the epitaxial process together with the mass flow of the source gases, to thereby increase the control accuracy of the layer characteristics of the epitaxial layer.

More particularly, when forming an SiGe layer on a wafer through the epitaxial process, control of the mass flow of the germanium (Ge) gases through real time feedback of the ratio difference of germanium (Ge) may be insufficient to provide accurate control over the layer characteristics of the SiGe layer, since concentrations of germanium (Ge) source gases and boron (B) dopants may be complementary with each other in the epitaxial process. If, however, according to principles of the present inventive concepts, the boron (B) concentration and the boron (B) concentration difference are also be generated together with the germanium (Ge) composition ratio and the germanium (Ge) ratio difference, both the germanium (Ge) ratio difference and the boron (B) concentration difference may be supplied to the first and the second suppliers, respectively, in real time during the epitaxial process, thereby significantly increasing the accuracy of the in-line control over the layer characteristics of the SiGe layer in the epitaxial process.

Furthermore, the fluorescence spectrometer may also be used to detect and generate a boron (B) variation ratio. The boron (B) variation ration may allow an operator to promptly detect any environmental errors (including both process condition errors and system condition errors) when the boron (B) variation ratio is used to produce a warning alarm in response to detected errors.

While the present example embodiments relate to an apparatus and method providing improved control over the mass flow of the source gases and dopants in-line with an epitaxial process in which hetero elements may be grown on a silicon substrate, these same inventive concepts also apply to any other semiconductor manufacturing processes and apparatus in which two or more substances having different properties may be reacted with one another into a compound.

The foregoing example embodiments are not to be construed as limiting the inventive principles. Although a few example embodiments have been described, those skilled in the art will readily appreciate that many modifications are possible to those embodiments without materially departing from the novel teachings and advantages of the present inventive concepts. Accordingly, all such modifications are intended to be included within the scope of the present inventive concepts as defined in the appended claims. In the claims, means-plus-function clauses are intended to cover the structures described herein as performing the recited function and not only structural equivalents but also equivalent structures.

What is claimed is:

1. An apparatus for performing an epitaxial process, comprising:
   a process chamber in which an epitaxial layer is formed on a substrate using an epitaxial process;
   a first supplier supplying source gases for the epitaxial layer into the process chamber during the epitaxial process;
   a second supplier supplying dopants into the process chamber during the epitaxial process, the dopants being different from the source gases and reducing a band gap of the epitaxial layer;
   a detector detecting a composition ratio of the epitaxial layer and a concentration of the dopants in the epitaxial layer during the epitaxial process; and
   a controller controlling a mass flow of the source gases and a mass flow of the dopants in-line with the epitaxial process.

2. The apparatus of claim 1, wherein the detector includes:
   an irradiator radiating continuous x-rays onto the epitaxial layer while performing the epitaxial process in the process chamber;
   a diffractometer detecting diffraction spectrums of diffraction rays diffracted from the epitaxial layer and determining the composition ratio and a layer thickness of the epitaxial layer from a peak angle of the diffraction spectrums; and
   a fluorescence spectrometer detecting fluorescent x-rays resulting from the dopants of the epitaxial layer being exposed to the continuous x-rays and calculating the concentration of the dopants in the epitaxial layer using the fluorescent x-rays.

3. The apparatus of claim 2, wherein the irradiator includes an x-ray generating unit from which the continuous x-rays are generated using one or more of an aluminum (Al) plate and a magnesium (Mg) plate as a target metal plate, and further includes an irradiating unit radiating the continuous x-rays to the epitaxial layer at an irradiation angle.

4. The apparatus of claim 2, wherein the epitaxial layer is arranged on a plurality of test patterns, said plurality of test patterns being arranged on peripheral regions of dies defined by scribe lines, wherein the continuous x-ray has a beam size that is smaller than a surface of the test pattern, and wherein a respective test pattern is individually irradiated by a corresponding continuous x-ray beam.

5. The apparatus of claim 2, wherein the epitaxial layer is arranged on a plurality of test patterns, said plurality of test patterns arranged on peripheral regions of dies defined by scribe lines, wherein the continuous x-ray has a beam size corresponding to a unit shot covering a plurality of the dies, and wherein the continuous x-ray is radiated onto the dies by the unit shot such that a plurality of the test patterns are substantially simultaneously exposed to the continuous x-ray.

6. The apparatus of claim 2, wherein the controller includes a first operator, a second operator, a flow controller, and a central processing unit;
   said first operator having a reference ratio that is a reference composition ratio of the epitaxial layer, wherein said first operator compares the reference ratio with a detected ratio that is the composition ratio detected by the diffractometer;
   said second operator having a reference concentration that is a reference concentration of the dopants, wherein said second operator compares the reference concentration with a detected concentration that is the concentration of the dopants detected by the fluorescence spectrometer;
   said flow controller individually controlling the mass flow of the source gases based on a comparison result from the first operator, and individually controlling the mass flow of the dopants based on a comparison result from the second operators; and
   said central processing unit connected to the first and the second operators and transferring control signals to the process chamber, the first supplier, the second supplier, and the detector to control the epitaxial process.

7. The apparatus of claim 6, wherein the first supplier includes a source reservoir holding the source gases, a first supply tube through which the source gases are supplied from the source reservoir to the process chamber, and a first valve arranged on the first supply tube to control the mass flow of the source gases to the process chamber, wherein the second supplier includes a dopants reservoir holding the dopants, a second supply tube through which the dopants are supplied from the dopants reservoir to the process chamber, and a second valve arranged on the second supply tube to control the mass flow of the dopants to the process chamber, wherein the first valve is controlled by a first flow control signal generated from the flow controller based on the comparison results of the first operator, and wherein the second valve is controlled by a second flow control signal generated from the flow controller based on the comparison result of the second operator.

8. The apparatus of claim 6, wherein the central processing unit is configured to generate a check signal that indicates to an operator the need to check process environments of the epitaxial process when a ratio of a variation of the detected concentration with respect to a variation of the mass flow of the dopants is negative.

9. The apparatus of claim 1, wherein the epitaxial layer includes at least one of a gallium arsenide indium (InGaAs) layer and a silicon germanium (SiGe) layer and wherein the dopant includes at least one of carbon (C) and boron (B).

10. A method of forming an epitaxial layer on a substrate, the method comprising:
setting process conditions for an epitaxial process performed in a process chamber in which the substrate is arranged, the process conditions including:
a mass flow of source gases for the epitaxial layer,
a mass flow of dopants that is different from the source gases and reduces a band gap of the epitaxial layer,
a reference composition ratio of the source gases, and
a reference concentration of the dopants for the epitaxial layer;
performing an epitaxial process under the process conditions, thereby forming the epitaxial layer on the substrate;
detecting a composition ratio of the source gases and a concentration of the dopants in the epitaxial layer by analyzing the epitaxial layer, and providing a detected ratio and a detected concentration;
obtaining a ratio difference between the detected ratio and a reference ratio, wherein the reference ratio is a reference value of the composition ratio of the epitaxial layer, and obtaining a concentration difference between the detected concentration and a reference concentration, wherein the reference concentration is a reference value of the concentration of the dopants; and
changing the mass flow of the at least one of the source gases and the dopants in response to the ratio difference and the concentration difference during the epitaxial process when at lest one of the ratio difference and the concentration difference is outside an allowable range.

11. The method of claim 10, wherein the detected ratio is obtained using x-ray diffractometry, in which continuous x-rays are radiated to the epitaxial layer and diffraction spectrums of diffraction rays that are diffracted from the epitaxial layer are measured to detect a peak angle of the diffraction spectrums, and wherein the composition ratio is determined using the peak angle of the diffraction spectrums together with a layer thickness of the epitaxial layer; and
wherein the detected concentration is obtained using x-ray fluorescent spectrometry, in which the concentration of the dopants in the epitaxial layer is determined by detecting fluorescent x-rays resulting from the dopants of the epitaxial layer in response to the continuous x-rays.

12. The method of claim 11, wherein the x-ray diffractometry and the x-ray fluorescent spectrometry are individually performed on each test pattern on the substrate, with the continuous x-ray being individually radiated onto the test pattern being evaluated.

13. The method of claim 11, wherein the x-ray diffractometry and the x-ray fluorescent spectrometry are performed by a unit shot covering a plurality of dies of the substrate, so that the continuous x-ray is radiated onto a plurality of test patterns arranged on the same die at the same time.

14. The method of claim 10, wherein the steps of performing the epitaxial process under the changed mass flow of at least one of the source gases and the dopants, detecting the composition ratio of the source gases and the concentration of the dopants in an epitaxial layer under the changed mass flow of the source gases and the dopants, obtaining the ratio difference and the concentration difference and changing again the mass flow of at least one of the source gases and the dopants are repeatedly performed throughout the epitaxial process until the ratio difference and the concentration difference are within allowable ranges.

15. The method of claim 14, further comprising changing at least one of environmental conditions of the epitaxial process other than the mass flow of the source gases and the mass flow of the dopants when the detected concentration is outside of the allowable range and when a ratio of a variation of the detected concentration of the dopants with respect to a variation of the mass flow of the dopants is negative.

16. An epitaxial process apparatus, comprising:
a process chamber in which a wafer having a substrate is arranged during an epitaxial process, wherein an epitaxial layer is formed on the substrate during the epitaxial process;
a first supplier connected to the process chamber to supply one or more source gases to the process chamber during the epitaxial process;
a second supplier connected to the process chamber to supply one or more dopants to the process chamber during the epitaxial process, the dopants being different from the source gases and reducing a band gap of the epitaxial layer;
an irradiator configured to supply a continuous x-ray to the epitaxial layer during the epitaxial process;
a diffractometer configured to detect a peak angle of diffraction spectrums received from the epitaxial layer in response to the continuous x-ray to allow a composition ratio of the source gases and a thickness of the epitaxial layer to be determined;
a fluorescence spectrometer configured to detect fluorescent x-rays resulting from the dopants in the epitaxial layer in response to the continuous x-ray to allow a concentration of dopants in the epitaxial layer to be determined; and
a controller configured to control a mass flow of one or more source gases into the process chamber based on a comparison of the composition ratio to a reference composition ratio, and further configured to control a mass flow of one or more dopants into the process chamber based on a comparison of the concentration of dopants to a reference concentration.

17. The epitaxial process apparatus of claim 16, wherein the first supplier comprises:
a source reservoir holding one or more source gases;

a first supply tube connecting the source reservoir to the process chamber; and a first valve arranged in the supply tube between the source reservoir and the process chamber, wherein the controller is configured to control the first valve to control the mass flow of source gases into the process chamber.

18. The epitaxial process apparatus of claim 16, wherein the second supplier comprises:

a dopants reservoir holding one or more of the dopants;

a second supply tube connecting the dopants reservoir to the process chamber; and a second valve arranged in the second supply tube between the dopants reservoir and the process chamber, wherein the controller is configured to control the second valve to control a mass flow of the dopants into the process chamber.

19. The epitaxial process apparatus of claim 16, further comprising a first valve and a second valve, wherein the first valve is configured to control a mass flow of source gases into the process chamber under the control of the controller, and wherein the second valve is configured to control a mass flow of dopants into the process chamber under the control of the controller.

20. The epitaxial process apparatus of claim 16, further comprising a dopant variation detector determining a dopant variation ratio by comparing a variation of the determined dopant concentration to a variation in the mass flow of the dopants, wherein the dopant variation detector is configured to generate an abnormal process signal in response to a negative dopant variation ratio, wherein the abnormal process signal is used to indicate to an operator a need to check the epitaxial process conditions.

* * * * *